(12) United States Patent
Thompson et al.

(10) Patent No.: US 6,191,635 B1
(45) Date of Patent: Feb. 20, 2001

(54) LEVEL SHIFTING CIRCUIT HAVING A FIXED OUTPUT COMMON MODE LEVEL

(75) Inventors: John Thompson, Macclesfield; Raymond Filippi, Swindon, both of (GB)

(73) Assignee: Telefonaktiebolaget LM Ericsson, Stockholm (SE)

( * ) Notice: Under 35 U.S.C. 154(b), the term of this patent shall be extended for 0 days.

(21) Appl. No.: 09/387,087

(22) Filed: Aug. 31, 1999

(30) Foreign Application Priority Data

Sep. 3, 1998 (GB) .................................................. 9819245

(51) Int. Cl.$^7$ ....................................................... H03L 5/00
(52) U.S. Cl. .............................. 327/333; 326/75; 326/126
(58) Field of Search ................................. 327/333, 306, 327/530; 326/63, 75, 80, 89, 126

(56) References Cited

U.S. PATENT DOCUMENTS

| | | | |
|---|---|---|---|
| 3,660,679 | 5/1972 | Ishigaki et al. | 307/231 |
| 4,368,395 | 1/1983 | Taylor | 307/455 |
| 4,769,590 | 9/1988 | Taylor | 323/315 |
| 5,034,635 | 7/1991 | Ten Eyck | 307/475 |
| 5,349,253 | 9/1994 | Ngo et al. | 307/475 |
| 5,369,313 | 11/1994 | Yoshihara | 326/68 |
| 5,446,400 | 8/1995 | Nogle | 326/64 |
| 5,502,405 | 3/1996 | Williams | 326/66 |
| 5,600,267 | 2/1997 | Wong et al. | 326/73 |
| 5,606,272 | * 2/1997 | Behbahani et al. | 327/65 |
| 5,646,515 | 7/1997 | Mayes et al. | 323/313 |

FOREIGN PATENT DOCUMENTS

| | | |
|---|---|---|
| 4012914 | 4/1990 | (DE) . |
| 0060342A1 | 9/1982 | (EP) . |
| 0217504 | 4/1987 | (EP) . |
| 0282 725A1 | 9/1988 | (EP) . |
| 0317271 | 11/1988 | (EP) . |
| 414096 | 8/1990 | (EP) . |
| 453191 | 4/1991 | (EP) . |
| 0590246A3 | 4/1994 | (EP) . |
| 765036 | 3/1997 | (EP) . |
| 62-230223 | 8/1987 | (JP) . |
| 63-007014 | 1/1988 | (JP) . |
| 63-107238 | 5/1988 | (JP) . |
| 4-315314 | 11/1992 | (JP) . |
| 5-315936 | 11/1993 | (JP) . |
| 6-260925 | 9/1994 | (JP) . |

OTHER PUBLICATIONS

Quirk, E., UK Search Report Under Section 17(5); dated Oct. 20, 1998 on application No. GB9819245.3, pp. 1–3.

Feuer, F., International Search Report on International App. No. PCT/EP99/06432 dated Nov. 24, 1999, pp. 1–9.

* cited by examiner

Primary Examiner—Terry D. Cunningham
Assistant Examiner—Quan Tra
(74) Attorney, Agent, or Firm—Jenkens & Gilchrist, P.C.

(57) ABSTRACT

The invention relates to an electronic circuit, and in particular embodiments to a level shifting circuit having an output common mode voltage independent of the input common mode voltage, and unity differential signal gain. The circuit receives first and second input voltages, referenced to a first voltage supply rail, and has first and second resistors, each connected to the first input terminal, and third and fourth resistors, each connected to the second input terminal, the second and third resistors having equal resistance values. The first resistor is also connected to a first output terminal, the fourth resistor is also connected to a second output terminal, and the second and third resistors are also connected together at a reference node. A first current source draws a current through the first resistor, a second current source draws a current through the fourth resistor, and a third current source draws a current through the second and third resistors and the reference node, and sets a reference voltage, referenced to the second voltage supply rail, at the reference node. The first and fourth resistors, and the first and third current sources, are such that the voltage drops across the first and fourth resistors are equal.

8 Claims, 5 Drawing Sheets

US 6,191,635 B1

LEVEL SHIFTING CIRCUIT HAVING A FIXED OUTPUT COMMON MODE LEVEL

TECHNICAL FIELD OF THE INVENTION

This invention relates to an electronic circuit, and more specifically to a level shifting circuit, and more specifically to a circuit which achieves analog signal level shifting, for example, level shifting a current mode logic signal from the positive to the negative rail in a circuit.

BACKGROUND OF THE INVENTION

In current mode logic (CML) circuits, voltages are typically referenced from the most positive supply voltage. However, an analog circuit connected to such a digital CML circuit may need to have its threshold voltages referenced to the negative supply. As a result, at the digital/analog interface, there is a need for a circuit which shifts the signal level between the two voltage supply rails.

JP-A-5-315936 discloses a level shifting circuit in which an input signal is applied to the base of a first NPN transistor. The emitter of this first transistor is connected to the collector terminal of a second NPN transistor and also, through a resistor, to the base of the second NPN transistor the base of this second transistor is connected to ground through a first current source circuit, while the emitter terminal of this second transistor is connected to ground through a second current source circuit, and the emitter terminal of the second transistor also acts as the circuit output.

JP-A-6-260925 discloses a further level shift circuit, in which first and second input terminals, for receiving a differential input voltage, are connected to the bases of first and second NPN transistors. The collector terminals of these transistors are connected together, and the emitter terminals are connected to respective output terminals which receive a differential output voltage. The emitters of these transistors are further connected through respective resistors to respective halves of a current mirror circuit.

An object of the present invention is to provide a level shifting circuit which, in preferred embodiments, can maintain a differential signal gain of unity, and, again in preferred embodiments, can provide a fixed output common mode level which is independent of the supply voltage and the input common mode voltage.

SUMMARY OF THE INVENTION

In accordance with a preferred aspect of the invention, first and second input terminals are connected across first and fourth resistors respectively to first and second output terminals. The first and-second input terminals are also connected respectively across second and third resistors to a reference node at which there appears a reference voltage, defined with reference to a different supply rail from that to which the input terminals are referred. The third and fourth resistors have equal resistance values. Means are provided for drawing currents through the first and fourth resistors, and from the reference node, to that supply rail. These current drawing means, and the resistance values of the four resistors, are chosen such that the voltage drops across the first and fourth resistors are equal. This has the advantage that the output voltage is referenced to the second voltage supply rail.

Preferably, these components are chosen such that, in the balanced condition, in which the input voltages are equal, the voltage drops across all four resistors are equal.

This has the advantage that the circuit then has unity gain from input to output.

DETAILED DESCRIPTION OF PREFERRED EMBODIMENTS

Figure 1:
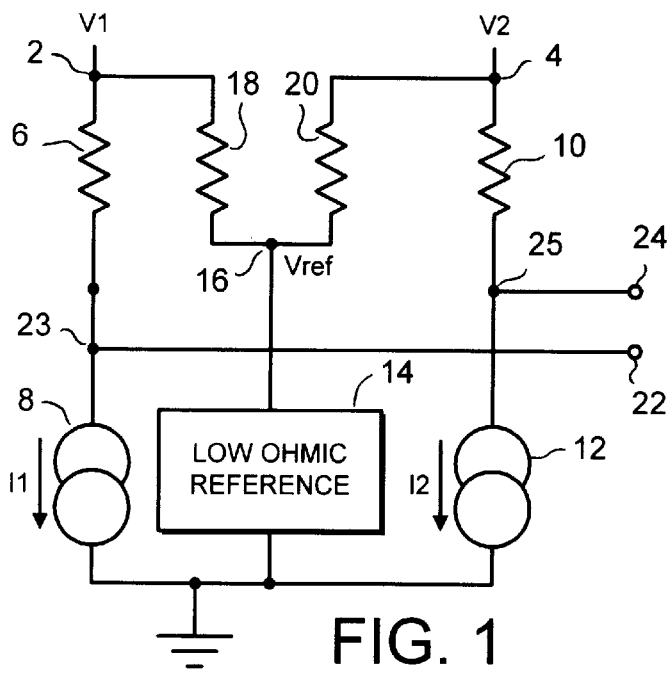
FIG. 1 is a schematic circuit diagram illustrating the principle of operation of a circuit in accordance with the present invention.

FIG. 1 serves to illustrate the operating principle of a level shifting circuit in accordance with the invention. Input voltages V1 and V2, which are referenced to a positive supply, are applied to respective first and second input terminals 2, 4. The first input terminal 2 is connected through a resistor 6 and a first controlled current source 8, which draws a current I1, to ground, or another negative supply rail. The second input terminal 4 is connected to the same negative supply rail through a second resistor 10 and a second controlled current source 12 which draws a current I2.

A low ohmic reference 14 is also connected to the negative supply rail, and sets a reference voltage Vref relative thereto at a node 16, and further serves to draw a current from the node 16 to the negative supply rail. The input terminal 2 is connected to the node 16 through a third resistor 18, and the input terminal 4 is connected to the node 16 through a fourth resistor 20.

A first output terminal 22 is connected to a node 23 between the first resistor 6 and first current source 8, and a second output terminal 24 is connected to the node 25 between the second resistor 10 and second current source 12.

By appropriate selection of components, the current I1 drawn by the first current source 8, the current I2 drawn by the second current source 12, and the current drawn by the low ohmic reference 14 can be chosen to have a known relationship between them. For example, they can be in a known ratio. The result is that the output voltages on the output terminals 22, 24 are then defined with reference to the reference voltage Vref at the node 16, and hence with reference to the negative supply rail, while there is also a known relationship between the output voltages at the terminals 22, 24 and the input voltages V1 and V2 at the input terminals 2, 4.

Figure 2:
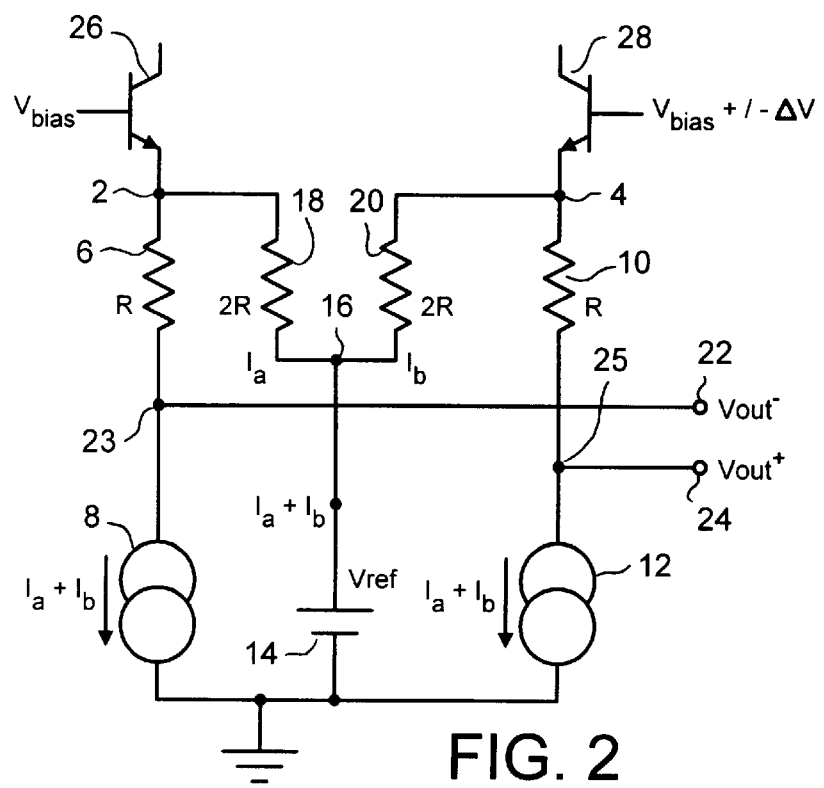
FIG. 2 is a further schematic diagram representing a circuit in accordance with the invention.

FIG. 2 is a slightly more detailed version of FIG. 1, in which the same reference numerals are used to refer to the same components. In the circuit of FIG. 2, the first and second resistors 6, 10 are chosen to have the same resistance value R, while the third and fourth resistors 18, 20 are selected to have a resistance value 2R, that is, twice the resistance value of resistors 6, 10. The current sources 8, 12 and the reference voltage source 14 are chosen to draw equal currents referred to as Ia+Ib, where Ia is defined as the current through the third resistor 18, and Ib is defined as the current through the fourth resistor 20.

The input voltage at terminal 2 is defined with reference to a positive supply voltage, in that a transistor 26 has its collector terminal connected directly or indirectly to the positive supply rail (not shown), a bias voltage Vbias is connected to the base thereof, and the emitter terminal thereof is connected to the terminal 2. A transistor 28 is similarly connected between the positive supply rail (not shown) and the second input terminal 4, and the voltage applied to the base thereof is equal to the bias voltage Vbias+/−ΔV. The voltages applied to the input terminals 2, 4 differ in each case from the voltages applied to the respective base terminals of the transistors connected thereto by the base-emitter voltage and, provided that these are chosen to be the same, the voltages at the input terminals 2, 4 will therefore differ by +/−ΔV, to a first approximation.

Therefore, as in the circuit of FIG. 1, the output voltages at the output terminals 22, 24 will be centered around the reference voltage Vref, and the difference between these output voltages Vout⁻ and Vout⁺ will be +/−ΔV.

Therefore, the circuit provides a level shift from the positive to the negative rail which is independent of the common mode input voltage and the supply voltage, and produces a differential gain of unity.

Figure 3:
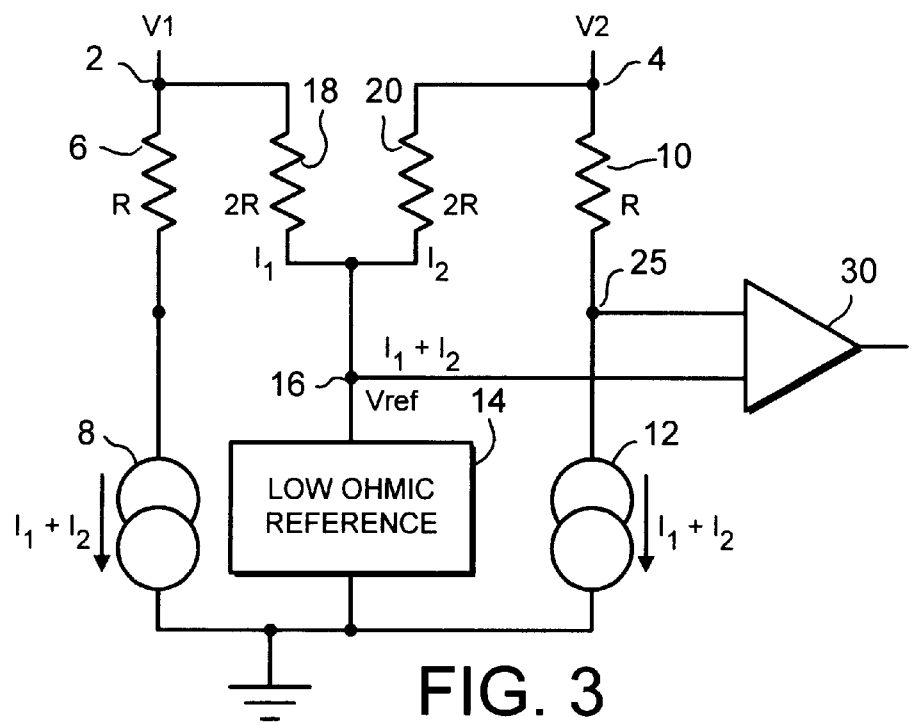
FIG. 3 is a further diagram illustrating an alternative circuit in accordance with the invention.

FIG. 3 shows a circuit similar to that of FIG. 1, which can be used to provide a single ended output. Components having the same reference numerals as components of the circuit of FIG. 1 have the same functions, and will not be described further. The output from the circuit, which is provided to a differential amplifier 30, is single ended. Thus, one input terminal of the amplifier 30 is supplied from the node 16, which is held at the reference voltage Vref, while the other input terminal is supplied from the node 25 which connects with the resistor 10 to the current source 12. The voltage V(32) at this node is given by:

$$V(32)=Vref+\tfrac{1}{2}(V2-V1).$$

Thus, although this circuit has first and second outputs available, the signal supplied to the amplifier 30 is taken from the reference node 16 and only one of the output terminals 23, 25.

Figure 4:
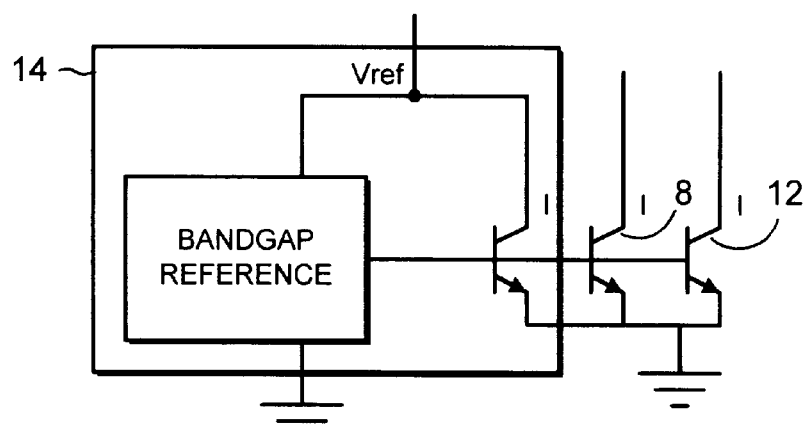
FIG. 4 represents an element of the circuit of FIG. 3.

FIG. 4 shows the form of the low ohmic reference 14 which is shown in FIGS. 1 and 3, and. its relationship with the current sources 8, 12. In this illustrative example, the current sources are NPN transistors, which have their bases connected together, such that the currents which they draw are in the same ratio as their emitter areas (in this case they are equal). The reference voltage Vref is also set by the voltage drop across the transistor 14.

Figure 5:
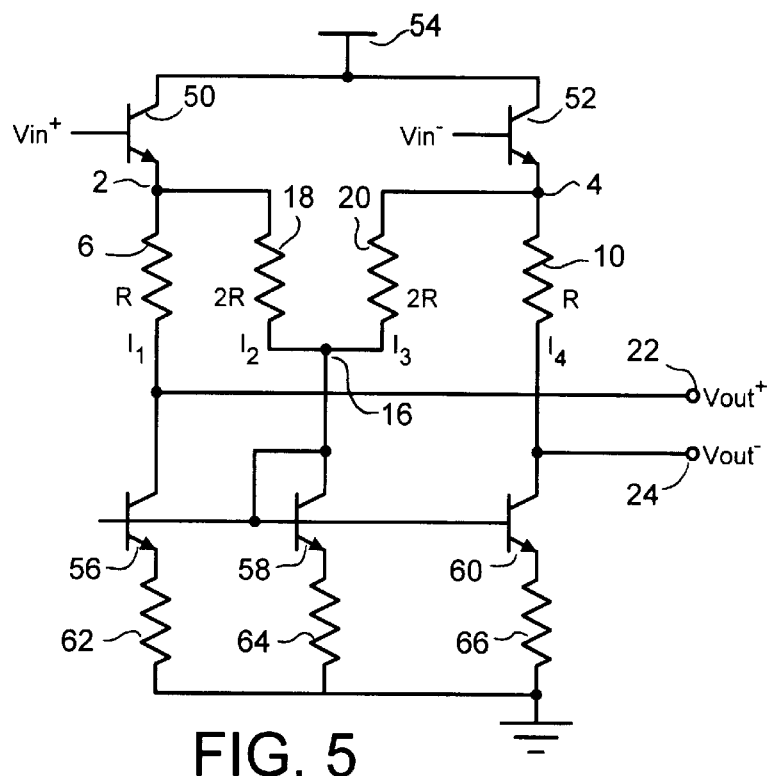
FIG. 5 is a further circuit diagram representing an embodiment of the invention.

FIG. 5 shows a furthew circuit in accordance with the invention, which is of lower precision, but which is satisfactory for many purposes, for example in current mode logic digital-to-analog interfaces. Again, components of this circuit which have the same function as components of the circuits shown in FIGS. 1, 2 and 3 have the same reference numerals, and will not be described further. In the circuit of FIG. 5, the input voltages Vin⁺ and Vin⁻ are applied to the base terminals of NPN transistors 50, 52 respectively, the collector terminals of which are connected in common to a positive supply rail 54. The emitter terminal of transistor 50 is connected to the terminal 2, and the emitter terminal of the transistor 52 is connected to the terminal 4. The current sources and voltage reference, described earlier, are provided in this embodiment of the invention by means of three matched NPN transistors 56, 58, 60, and three resistors 62, 64, 66. The base terminals of the transistors 56, 58, 60 are connected in common, and the transistors are matched. The collector terminal of the transistor 56 is connected to the output terminal 22, the collector terminal of the transistor 60 is connected to the output terminal 24, and the collector terminal of the transistor 58 is connected to the reference voltage node 16. Further, the base and collector terminals of the transistor 58 are connected together. A first resistor 62 is connected between the emitter terminal of the transistor 56 and ground, a second resistor 64 is connected between the emitter terminal of the resistor 58 and ground, and the third resistor 66 is connected between the emitter terminal of the resistor 60 and ground. The resistors 62, 64 and 66 are matched such that they have the same resistance value.

Thus, since the base voltages of the transistors 56, 58, 60 are constrained to be the same, and the emitter terminals of these transistors are connected to ground through equal resistors, the currents drawn through the transistors 56, 58, 60 are equal. Thus, with the current through the resistor 6 and transistor 56 being defined as $I_1$, with the current through the resistor 18 being defined as $I_2$, the current through the resistor 20 being defined as $I_3$, and the current through the resistor 10 and transistor 60 being defined as $I_4$:

$$I_1=I_2+I_3=I_4.$$

As in the circuit of FIG. 2, with the currents through the transistors 56, 58, and 60 being equal, and the resistors 18, 20 having resistance values which are twice those of the resistors 6, 10, the differential signal gain between the input terminals 2, 4 and the output terminals 22, 24, is unity, and the output signal is centered around the reference voltage at the node 16. In the circuit of FIG. 5, this is equal to the base-emitter voltage of the transistor 58, plus the voltage drop across the resistor 64. Thus, the reference voltage Vref at the node 16 can be set by an appropriate choice of value for the resistors 62, 64, 66.

The circuit therefore provides level shifting with the common mode output level being independent of the common mode input level.

It will be noted that the implementation shown in FIG. 5 uses only NPN transistors, which means that the device is particularly well suited to high frequency applications. However, it will be apparent that implementations are possible which use PNP transistors, for example for shifting from the negative supply rail to the positive, or which use CMOS transistors rather than bipolar transistors, or in BiCMOS.

Figure 6:
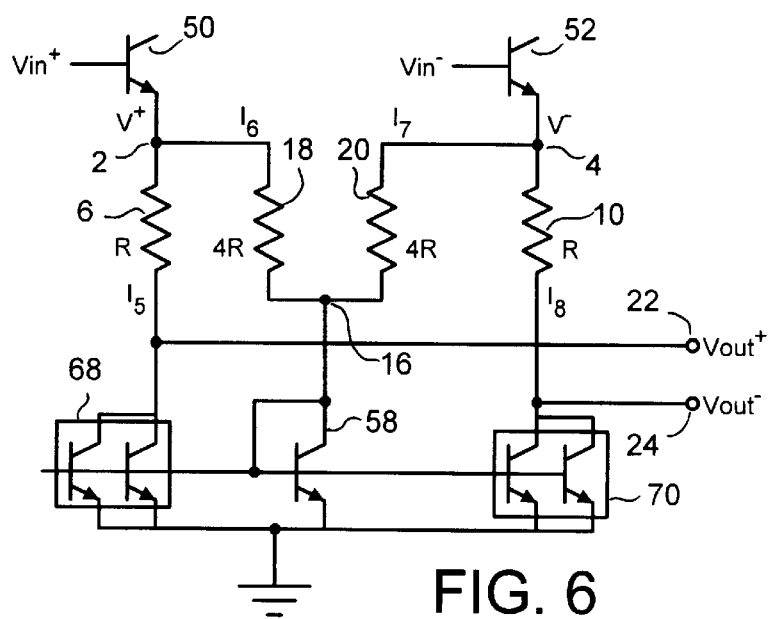
FIG. 6 is a further circuit diagram representing an alternative embodiment of the invention.

FIG. 6 is a circuit diagram showing an alternative embodiment of the invention, in which, again, components which have the same functions as components of the circuit of FIG. 5 have the same reference numerals as in FIG. 5. In the circuit of FIG. 6, the resistors 62, 64, and 66 have been removed, so that the reference voltage Vref at the node 16 is equal to the base-emitter voltage of the transistor 58.

Further, the transistors 68, 70, drawing current through the resistors 6, 10 respectively, have been replaced by NPN transistors which have emitter areas which are twice as large as that of the transistor 58. Since, as in the circuit of FIG. 5, the base-emitter voltages of the transistors 58, 68, 70 are held the same, this means that the currents drawn through the transistors 68, 70 are each twice the current which is drawn through the transistor 58. Correspondingly, the resistors 18, 20 have resistance values which are double the resistance values of the resistors 18, 20 in the circuit of FIG. 5, namely four times the resistance values of the resistors 6, 10. The result is that, with the current through resistor 6 being denominated $I_5$, the current through the resistor 18 being denominated $I_6$, the current through the resistor 20 being denominated $I_7$, and the current through the resistor 10 being denominated $I_8$.

$$I_6 + I_7 = \tfrac{1}{2} I_5 = \tfrac{1}{2} I_8.$$

However, the voltage drops across the resistors 6, 10 are still equal, and, in view of the altered resistance values, the sum of the voltage drops across the resistors 18, 20 is still equal to the sum of the voltage drops across the resistors 6, 10. Indeed, in the balanced input condition, when the input voltages are equal, the voltage drops across all four of the resistors are equal. This ensures that the circuit still has a differential gain of unity.

If the transistors 58, 68, 70 are chosen such that the respective currents draw; therethrough are in some other relationship, the resistance values of the resistors 6, 10, 18, 20 can be adjusted either to maintain a differential signal gain of unity, or to attain a desired differential signal gain, as required.

The circuit therefore provides level shifting with the common mode output level being independent of the common mode input level.

Figure 7:
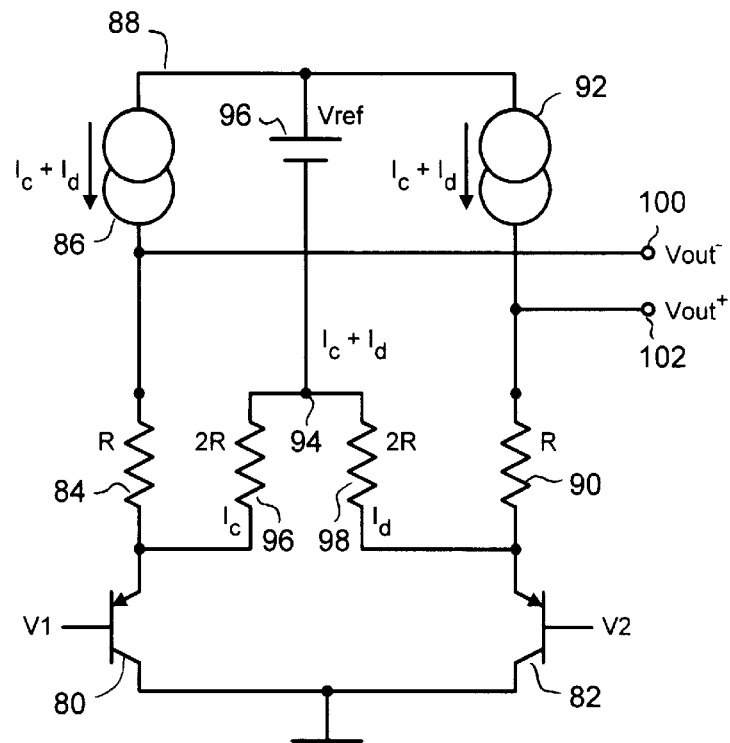
FIG. 7 is a further circuit diagram representing a further alternative embodiment of the invention.

FIG. 7 shows an alternative circuit in accordance with the invention, in which the output voltage is shifted from the negative supply rail to the positive supply, rather than the reverse, which is the case shown in the earlier embodiments. Thus, in the circuit of FIG. 7, input voltages V1 and V2 are supplied to the base terminals of respective input PNP transistors 80, 82, the collector terminals of which are connected to the negative supply rail. The emitter terminal of the transistor 80 is connected through a resistor 84 and a current source 86 to the positive supply rail 88, and the emitter terminal of the transistor 82 is connected to the positive supply rail 88 through a resistor 90 and a current source 92. Further, the reference voltage Vref is set at node 94 by a reference voltage source and current source 96. The emitter terminal of the transistor 80 is connected to the node 94 through a resistor 96, and the emitter terminal of the transistor 82 is connected to the node 94 through a resistor 98. A first output terminal 100 is connected between the resistor 84 and current source 86, and a second output terminal 102 is connected between the resistor 90 and current source 92.

As, for example, in the embodiment of FIG. 2, the current sources 86, 92, 96 all draw equal currents (Ic+Id), with Ic being the current through the resistor 96, and Id being the current through the resistor 98.

Thus, this circuit has similar properties to that of FIG. 2, in that it provides an output voltage centered around a reference voltage which can be set, and which has a differential signal gain of unity, but, in this case, the output voltage is referenced to the positive supply rail when the input voltage is referenced to the negative supply rail, rather than vice versa as in FIG. 2.

Figure 8:
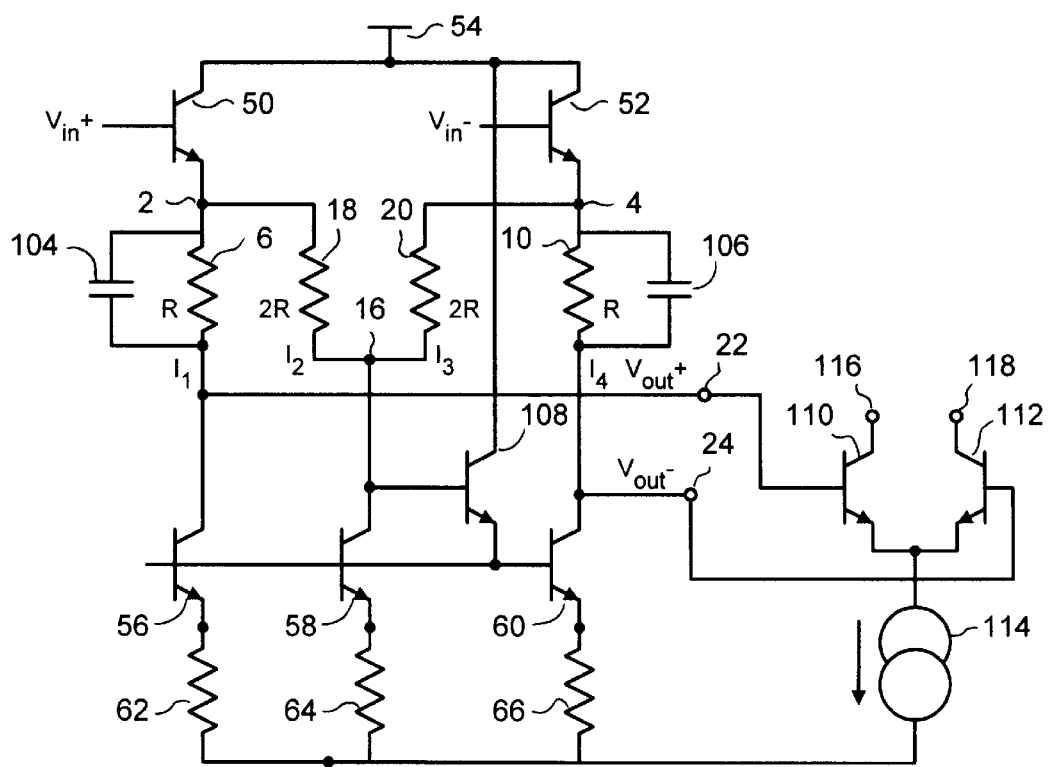
FIG. 8 is a circuit diagram showing a further alternative embodiment of the invention.

FIG. 8 is a circuit diagram of a further circuit in accordance with the invention. As with earlier circuits, this circuit is intended to shift the input signal level from the positive supply rail to the negative supply rail. The circuit of FIG. 8 is based on the circuit of FIG. 5, but includes various optional modifications thereof, which can be implemented in appropriate circumstances.

Specifically, the circuit includes a first capacitor 104 connected in parallel with the resistor 6, and a second capacitor 106 connected in parallel with the resistor 10. These capacitors improve the high frequency performance of the device, and improve the transient response to changes in the input signal level. The appropriate capacitance values of the capacitors can be chosen in dependence on the required performance.

Also, an NPN transistor 108 has its collector terminal connected to the positive supply rail 54, its base terminal connected to the node 16, and its emitter terminal connected to the base terminals of the transistors 56, 58, 60. This will have the effect of increasing the reference voltage at the node 16 by the base-emitter voltage of the transistor 108. In some circuits, this may be required to provide sufficient headroom for the current source 114. Moreover, the transistor 108 acts as a β helper, increasing the accuracy of the circuit.

The output voltages Vout$^+$ and Vout$^-$ from the level shifting circuit output terminals 22, 24 respectively, are applied, respectively, to the base terminal of transistors 110 and 112, the emitter terminals of which are connected in common through a current source 114 to the negative supply rail. The required differential output current then appears on the collector terminals 116, 118 of these two transistors.

Figure 9:
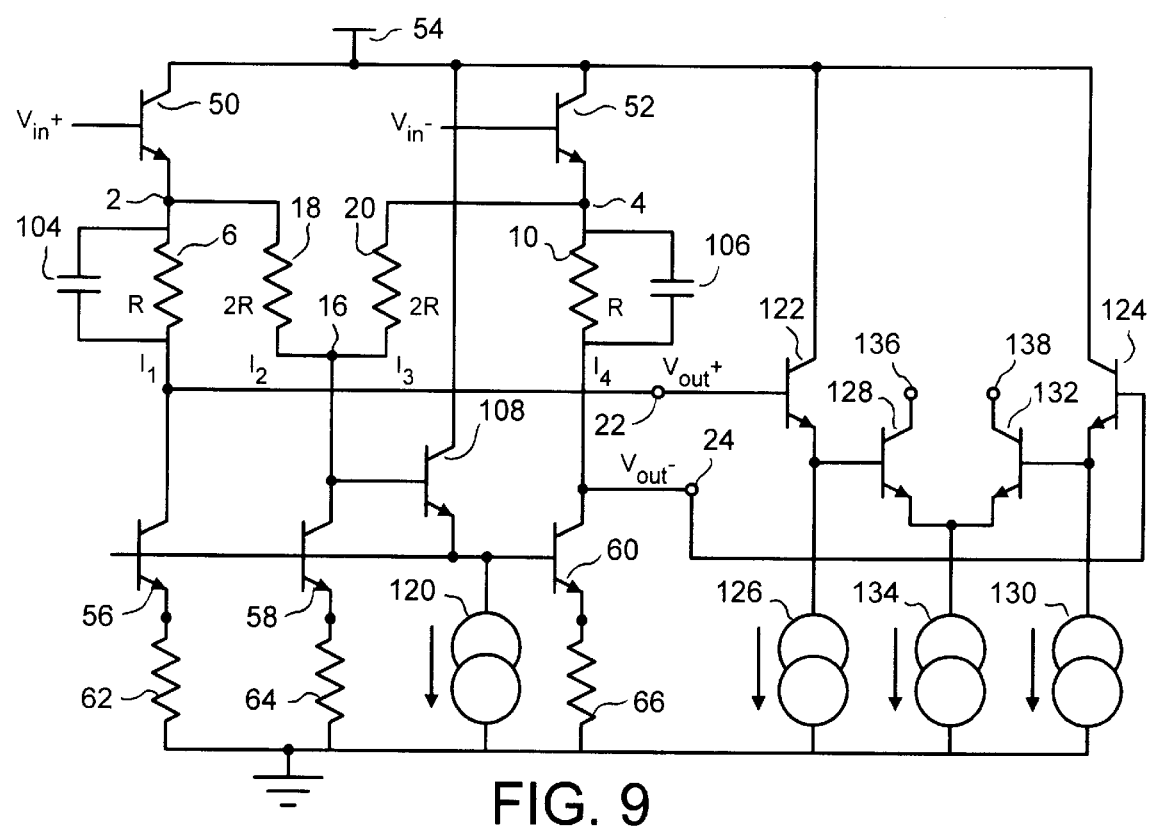
FIG. 9 is a circuit diagram showing a particularly preferred embodiment of the invention.

FIG. 9 shows a further circuit in accordance with the invention, which is based on the circuit of FIG. 8, but includes further optional modifications thereto, and features of the circuit of FIG. 9 which have the same function as corresponding features of the circuit of FIG. 8 are indicated by the same reference numerals, and will not be described further.

In the circuit of FIG. 9, a current source 120 is connected between the emitter terminal of the transistor 108 and the negative supply rail, which further alters the reference voltage at the node 16 by defining the base-emitter voltage of the transistor 108. The current source can usefully be set to draw a current which is in a fixed ratio to that drawn by the current source 126, to define a chosen temperature coefficient of the circuit.

Further, in order to reduce the load currents which may be supplied to the transistors on the output side of the circuit, the output voltages from the level shifting circuit Vout$^+$ and Vout$^-$, on the terminals 22, 24 respectively, are supplied to the respective base terminals of Darlington configuration NPN transistors 122, 124, the collector terminals of which are connected to the positive supply rail 54. The emitter terminal of the transistor 122 is connected to the negative supply rail through a current source 126, and to the base terminal of an NPN transistor 128. The emitter terminal of the transistor 124 is connected to the negative supply rail through a current source 130, and to the base terminal of an NPN transistor 132. The emitter terminals of the transistors 128, 132 are connected to the negative supply rail through a current source 134, and the respective collector terminals thereof form the differential output terminals 136, 138 respectively.

There are thus disclosed circuits which provide level shifting of input signals from one voltage supply rail to the opposite supply rail and, in advantageous embodiment thereof, allow a differential signal gain of unity with a controllable common mode output level, independently of the supply voltage and the input common mode voltage.

What is claimed is:

1. A level shift circuit, having first and second voltage supply rails, the circuit comprising:

(a) a first input terminal, connected to receive a first input voltage, referenced to the first voltage supply rail;

(b) a second input terminal, connected to receive a second input voltage, referenced to the first voltage supply rail;

(c) first and second resistors, each having respective first and second terminals, each of the first terminals being connected to the first input terminal;

(d) third and fourth resistors, each having respective first and second terminals, each of the first terminals being connected to the second input terminal, the second and third resistors having equal resistance values, the second terminal of the first resistor being connected to a-first output terminal, the second terminal of the fourth resistor being connected to a second output terminal, and respective second terminals of the second and third resistors being connected together at a reference node;

(e) a first current source, connected to draw a current through the first resistor;

(f) a second current source, connected to draw a current through the fourth resistor; and (g) a third current source, connected to draw a current through the second and third resistors and the reference node, and setting a reference voltage, referenced to the second voltage supply rail, at the reference node;

wherein the first and fourth resistors, and the first and third current sources, are such that the voltage drops across the first and fourth resistors are equal.

2. A level shift circuit as claimed in claim 1, wherein the first, second, third and fourth resistors, and the first, second and third current sources, are such that, in the balanced condition, in which the first and second input voltages are equal and hence the currents through the second and third resistors are equal, the voltage drops across the second and third resistors are each equal to the voltage drops across the first and fourth resistors.

3. A level shift circuit as claimed in claim 1 or 2, wherein the currents drawn by the first, second third current sources are equal, the first and fourth resistors have equal resistance values, and the second and third resistors have equal resistance values which are twice the resistance value of the first and fourth resistors.

4. A level shift circuit as claimed in claim 1, wherein the first, second and third current sources comprise respective first, second and third transistors, each having respective control terminals and current paths, and wherein the first, second and third transistors are connected to receive the same voltages on their respective control terminals.

5. A level shift circuit as claimed in claim 4, wherein the first, second and third transistors are NPN transistors.

6. A level shift circuit as claimed in claim 4, wherein the currents drawn by the first, second and third current sources are determined by the emitter areas of the first, second and third transistors.

7. A level shift circuit as claimed in claim 4, further comprising fifth, sixth and seventh resistors connected in series with the first, second and third transistors respectively, the fifth, sixth and seventh resistors having equal resistance values.

8. A level shift circuit as claimed in claim 1, comprising fourth and fifth NPN transistors, each having respective base, collector and emitter terminals, wherein the collector terminals of the fourth and fifth transistors are connected to the first voltage supply rail, the base terminals of the fourth and fifth transistors are connected to receive the first and second input voltages respectively, and the emitter terminals of the fourth and fifth transistors are connected to the first and second input terminals respectively.

* * * * *

UNITED STATES PATENT AND TRADEMARK OFFICE
CERTIFICATE OF CORRECTION

PATENT NO. : 6,191,635 B1
DATED : February 20, 2001
INVENTOR(S) : Thompson et al.

It is certified that error appears in the above-identified patent and that said Letters Patent is hereby corrected as shown below:

Title page,
Item [54], Title, replace "LEVEL SHIFTING CIRCUIT HAVING A FIXED OUTPUT COMMON MODE LEVEL" with -- LEVEL SHIFTING CIRCUIT HAVING A FIXED COMMON MODE LEVEL --

Signed and Sealed this

Tenth Day of December, 2002

JAMES E. ROGAN
*Director of the United States Patent and Trademark Office*